United States Patent
Fiolka et al.

(10) Patent No.: US 9,213,245 B2
(45) Date of Patent: Dec. 15, 2015

(54) OPTICAL SYSTEM AND MULTI FACET MIRROR OF A MICROLITHOGRAPHIC PROJECTION EXPOSURE APPARATUS

(71) Applicant: Carl Zeiss SMT GmbH, Oberkochen (DE)

(72) Inventors: Damian Fiolka, Oberkochen (DE); Juergen Baier, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 362 days.

(21) Appl. No.: 13/715,000

(22) Filed: Dec. 14, 2012

(65) Prior Publication Data

US 2013/0100429 A1    Apr. 25, 2013

Related U.S. Application Data

(63) Continuation of application No. PCT/EP2010/003974, filed on Jul. 1, 2010.

(51) Int. Cl.
| | |
|---|---|
| *G03F 7/20* | (2006.01) |
| *G02B 26/06* | (2006.01) |
| *G02B 26/08* | (2006.01) |
| *G01B 11/14* | (2006.01) |
| *G02B 5/09* | (2006.01) |

(52) U.S. Cl.
CPC ............ *G03F 7/70266* (2013.01); *G01B 11/14* (2013.01); *G02B 5/09* (2013.01); *G02B 26/06* (2013.01); *G02B 26/0833* (2013.01); *G02B 26/0858* (2013.01); *G03F 7/70133* (2013.01); *G03F 7/70141* (2013.01)

(58) Field of Classification Search
CPC .............. G02B 26/06; G02B 26/0833; G02B 26/0858; G02B 5/09; G03F 7/70133; G03F 7/70141; G03F 7/70266
USPC ..................... 355/67; 359/850, 849, 862, 864
See application file for complete search history.

(56) References Cited

U.S. PATENT DOCUMENTS

| | | | |
|---|---|---|---|
| 3,749,785 A | 7/1973 | Goodrich | |
| 6,677,695 B2 * | 1/2004 | Dhuler et al. | ................. 310/309 |

(Continued)

FOREIGN PATENT DOCUMENTS

| | | | |
|---|---|---|---|
| JP | 2001 013427 A | 1/2001 | |
| JP | 2002 353105 A | 12/2002 | |

(Continued)

OTHER PUBLICATIONS

Japanese Office Action, with translation thereof, for JP Appl No. 2013-517026, dated Jul. 1, 2014.

(Continued)

*Primary Examiner* — Peter B Kim
*Assistant Examiner* — Michelle Iacoletti
(74) *Attorney, Agent, or Firm* — Fish & Richardson P.C.

(57) ABSTRACT

An optical system of a microlithographic projection exposure apparatus includes a multi facet mirror having a support plate and a plurality of mirror facets. Each mirror facet includes a mirror substrate and a reflective coating applied thereon, and is attached to the support plate. Actuators are provided that induce a deformation of the support plate. The deformation changes the orientation and/or position, but not the shape, of at least two mirror facets. In this way aberrations can be corrected.

18 Claims, 4 Drawing Sheets

(56) References Cited

U.S. PATENT DOCUMENTS

| | | |
|---|---|---|
| 2003/0234970 A1 | 12/2003 | Phillips et al. |
| 2005/0030653 A1 | 2/2005 | Holderer et al. |
| 2005/0068510 A1 | 3/2005 | Bleeker et al. |
| 2006/0012851 A1 | 1/2006 | Wu et al. |
| 2007/0297042 A1 | 12/2007 | Bifano |
| 2008/0100816 A1 | 5/2008 | Mulder et al. |
| 2009/0046278 A1 | 2/2009 | Kochersperger et al. |
| 2010/0020300 A1 | 1/2010 | Bouman et al. |
| 2010/0039629 A1 | 2/2010 | Xalter et al. |
| 2010/0253925 A1 | 10/2010 | Suzuki et al. |

FOREIGN PATENT DOCUMENTS

| | | |
|---|---|---|
| JP | 2004 047994 A | 2/2004 |
| JP | 2005 508520 A | 3/2005 |
| JP | 2005 136387 | 5/2005 |
| JP | 2008 118131 A | 5/2008 |
| JP | 2009 105378 A | 5/2009 |
| JP | 2009 118682 | 5/2009 |
| JP | 2009 217189 A | 9/2009 |
| JP | 2010 034553 A | 2/2010 |
| WO | WO 03/404796 | 5/2003 |
| WO | WO 2005/026843 | 3/2005 |
| WO | WO 2009/060906 | 5/2009 |

OTHER PUBLICATIONS

The International Search Report for the corresponding PCT Application No. PCT/EP2010/003974, mailed Mar. 29, 2011.

* cited by examiner

OPTICAL SYSTEM AND MULTI FACET MIRROR OF A MICROLITHOGRAPHIC PROJECTION EXPOSURE APPARATUS

CROSS-REFERENCE TO RELATED APPLICATIONS

The present application is a continuation of, and claims priority under 35 U.S.C. §120 to, international application PCT/EP2010/003974, filed Jul. 1, 2010, which is incorporated herein by reference in its entirety.

FIELD

The disclosure generally relates to an optical system, such as an illumination system or a projection objective, of a microlithographic projection exposure apparatus. The disclosure further relates to multi facet mirror which is configured to be mounted in such an apparatus.

BACKGROUND

Microlithography (also referred to as photolithography or simply lithography) is a technology for the fabrication of integrated circuits, liquid crystal displays and other microstructured devices. The process of microlithography, in conjunction with the process of etching, is used to produce patterns in thin film stacks that have been formed on a substrate, for example a silicon wafer. At each layer of the fabrication, the wafer is first coated with a photoresist which is a material that is sensitive to electromagnet radiation. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus generally includes an illumination system, a mask alignment stage for aligning the mask, a projection objective (sometimes also referred to as 'the lens') and a wafer alignment stage for aligning the wafer coated with the photoresist. The projection objective images, usually at a reduced scale, the circuit pattern, which is contained in the mask and illuminated by the illumination system, on the photoresist.

One of the main aims in the development of projection exposure apparatus is to be able to lithographically define features with smaller and smaller dimensions on the wafer. Small features lead to a high integration density, which generally has a favorable effect on the performance of the microstructured components that are produced with the aid of such apparatus.

The minimum size of the features that can be lithographically defined is approximately proportional to the wavelength of the projection light. Therefore the manufacturers of such apparatus strive to use projection light having shorter and shorter wavelengths. The shortest wavelengths currently used are 248 nm, 193 nm and 157 nm and thus lie in the deep ultraviolet (DUV) or vacuum ultraviolet (VUV) spectral range.

The next generation of commercially available apparatus will use projection light having an even shorter wavelength of about 13.4 nm which is in the extreme ultraviolet (EUV) spectral range. Because there are no optical materials available that are transparent for EUV light, it is generally not possible to use lenses or other refractive optical elements in such an apparatus. Instead, the optical systems of such an apparatus are catoptric, which means that all optical elements (including the mask) have to be reflective.

The illumination system of an EUV projection exposure apparatus usually includes one or more multi facet mirrors. Sometimes one multi facet mirror is provided that is used to determine the intensity distribution in a pupil surface of the illumination system. This intensity distribution, in turn, determines from which direction EUV projection light impinges on the mask. Another multi facet mirror is used to produce a plurality of secondary light sources that commonly illuminate the mask. In principle, a multi facet mirror may also be used in the projection objective, for example at a position in or in close proximity to a pupil surface.

A multi facet mirror usually contains a support plate to which the individual mirror facets are attached. Depending on the application of the multi facet mirror, the individual mirror facets may be first adjusted on the support plate and then fixedly attached to it, for example by soldering. Other multi facet mirrors include mirror facets which can be adjusted at any time with the help of actuators. Such a multi facet mirror is described in US 2005/0030653 A1.

However, multi facet mirrors are not only used in EUV projection exposure apparatus, but also in the illumination systems of DUV or VUV apparatus. In such systems the multi facet mirrors can be freely tilted about two orthogonal tilt axes and are used to define the intensity distribution in a pupil surface of the illumination system. Several embodiments of such a multi facet mirror are described in WO 2005/026843 A1.

In a microlithographic projection exposure apparatus there is sometimes a desire to slightly modify the optical properties of the multi facet mirror. For example, an optical system of the apparatus may suffer from reversible or irreversible degradations which often compromise the overall performance of the apparatus. In such cases it would be desirable to be able to modify the optical properties of the multi facet mirror so that a corrective effect is achieved.

The optical properties of multi facet mirror are determined by the optical properties of the mirror facets, and these, in turn, are mainly determined by their curvature, orientation and position.

For changing the orientation of the mirror facets it has been proposed to provide each mirror facet with one or more actuators so that the mirror facets can be moved, and in particular tilted, individually. However, providing all mirror facets with actuators is costly and increases the system complexity considerably. Even if the mirror facets are provided with such actuators anyway, it is sometimes very difficult to produce with these actuators minute—but extremely accurate— changes of the orientation of the mirror facets.

Thus there is a desire to provide an optical system of a microlithographic projection exposure apparatus including a multi facet mirror that can be used for correcting optical aberrations.

Outside the field of microlithography multi facet mirrors are sometimes used that have individual mirror facets which are either in an "on" or an "off" state. Such multi facet mirrors are often referred to as digital micro-mirror device (DMD) and may be realized as micro-electric mechanical system (MEMS). For such a DMD it has been proposed in US 2007/0297042 A1 to attach the individual mirror facets on a common thin support membrane that rests on a plurality of posts arranged between the mirror facets. Groups of four posts define the corners of rectangular membrane portions, and to each membrane portion one mirror facet is attached. By deforming the membrane portions with the help of actuators it is possible to displace the mirror facets attached to it. The actuators are configured in such a manner that the membrane has only two stable configurations which correspond to the "on" and "off" state of the attached mirror facet.

A similar DMD, but with individual membranes for each mirror facet, is described in WO 2009/060906 A1.

In optical systems of microlithographic projection exposure apparatus DMDs usually cannot be used, because there is no need for a digital switching of light beams. Apart from that such apparatus have extremely tight specifications with regard to the optical properties (curvature, position, orientation) of the mirror facets, and these specifications are usually not met by DMDs.

SUMMARY

The disclosure provides an optical system of a microlithographic projection exposure apparatus, wherein the optical system includes a multi facet mirror. The multi facet mirror includes a support plate and a plurality of mirror facets. Each mirror facet includes a mirror substrate and a reflective coating applied thereon, and is attached to the support plate. The multi facet mirror further includes at least one actuator that is configured to induce a deformation of the support plate. Each deformation induced by the at least one actuator changes the relative orientation and/or the position of at least two mirror facets without changing their shape.

The disclosure is based on the perception that it is sometimes not only simpler, but also more accurate to deform the support plate so that many spatially distributed mirror facets are moved simultaneously, instead of changing the orientation and/or position of the mirror facets individually. Moving two or more spatially distributed mirror facets in one go is effective because there are many causes of optical aberrations that are spatially distributed, too. For example, if a mirror in an illumination system changes its curvature as a result of a temperature change, this usually causes an aberration. For correcting this aberration, it generally does not suffice to move a single mirror facet. Instead, it will be desirable to (slightly) move a plurality of mirror facets that are spatially distributed over a certain area of the support plate.

Sometimes the aberration to be corrected is caused by an undesired deformation of the support plate itself. Obviously it is then the most straightforward approach to compensate this deformation by a suitable counter-deformation that is produced with the help of the at least one actuator.

Even if the optical system includes facet actuators that are configured to change the orientation and/or position of the mirror facets individually with respect to the support plate, the disclosure has its merits. By deforming the support plate it is possible to produce changes of the orientation and/or position of the mirror facets with a very high accuracy. For example, tilt angles of only a few microrad may be achieved if the support plate is deformed. If facet actuators are used to change the orientation and/or position of the mirror facets individually, the accuracy is usually about two or three orders of magnitude smaller.

In the context of the present disclosure the orientation of a mirror facet describes how it is aligned to the space it is in. The orientation is usually given relative to a frame of reference, which may be specified by a Cartesian coordinate system, and by indicating the rotations that would move the body from a base or starting orientation to its current orientation. Thus an orientation in the present sense may be described by a set of three rotational angles and a base of coordinate axes.

The term position is used in the context of the present application to denote the coordinates of a specific point of a mirror facet in the frame of reference. Thus a position in the present sense may be described by a set of three Cartesian coordinates and a base of coordinate axes. Therefore the orientation and the position of a mirror facet commonly describe how it is placed in space.

An actuator in the sense of the present disclosure is a mechanical device that takes energy and converts that into some kind of motion.

In one embodiment the at least one actuator is configured to induce a continuous range of different deformations of the support plate. Then also a continuous range of different aberrations can be corrected with the help of the multi facet mirror. However, there may be rare cases where there is only a single specific aberration for which correction is desired, for example if a particular illumination setting is used. Then it may suffice if the at least one actuator is capable of inducing only one deformation, or a discrete and restricted number of different deformations, of the support plate.

If the mirror facets are fixedly attached to the support plate in such a manner that they cannot be adjusted with respect to the support plate, the orientation and/or position of the mirror facets can only be changed with the help of the at least one actuator. In such a configuration the disclosure enables a common fine adjustment of all or at least a group of mirror facets. Of course, in contrast to an individual adjustment of the mirror facets, the changes of the orientation and/or position of the mirror facets will be linked to some extent.

According to the disclosure, the deformation of the support plate shall not affect the shape of the mirror facets. Here the term shape denotes geometrical quantities such as size and curvature of the mirror facets, but not orientation and position. One approach to avoid any impact of the support plate deformations on the shape of the mirror facets is to provide a gap which remains between a portion of the mirror substrate and the support plate. For example, the mirror facet may be connected to the support plate only via a small structure, in particular a small pin that has a cross-sectional area which is smaller than one half of the surface covered by the reflective coating, and preferably smaller than one fifth of this surface. However, even without such gaps the impact of support plate deformations on the shape of the mirror facets will often be negligible. This is because under real conditions the deformations of the support plate are significant only over an area that is much larger than the area of a single mirror facet.

In one embodiment the at least one actuator is configured to produce tensile and/or pressure forces on the support plate. In principle, however, also shear forces may be applied to the support plate if they can cause its deformation.

In another embodiment the at least one actuator includes a connector element which is connected to the support plate, a displacement element having a length that is variable by supplying energy to the displacement element, and a resilient member that is arranged between the connector element and the displacement element. The displacement element may be formed by a piezo electric element, for example. The resilient member should have a sufficiently high stiffness so that the forces produced by the displacement element are properly transferred to the connector element. The provision of a resilient member is advantageous because it makes it possible to produce precisely defined elastic forces that are used to deform the support plate.

In another embodiment the support plate has a top surface, over which the facet members are distributed, and a bottom surface to which the at least one actuator is connected. Such a configuration is particularly useful if the support plate is originally flat and shall be bended. In other embodiments the support plate has a circumferential surface to which the at least one actuator is connected. Particularly if the support plate is originally convexly or concavely curved, forces produced by actuators acting on the circumferential surface may be used to modify the curvature of the support plate. However, (additional) connectors that act on the circumferential surface may also be used to produce translational displacements of the support plate parallel to its surface.

According to still another embodiment the optical system includes a measurement system which is configured to measure the orientations of the mirror facets individually. The optical system of this embodiment further includes a control unit for controlling the at least one actuator depending on the orientations of the mirror facets that have been measured by the measurement system.

Such an optical system is particularly advantageous if the optical properties of the multi facet mirror shall be monitored during intervals between subsequent exposures or even during exposures. Then also transient aberrations, as they may be caused by changing heat distributions in optical elements, by an exchange of the mask, by changes of the illumination setting or by drift movements of optical elements, can be effectively corrected at least to some extent.

The measurement system may include a light source that is configured to direct a light beam on at least one mirror facet and a detector that is configured to detect the direction of the light beam after it has been reflected by the at least one mirror facet. Similar measurement systems are known for multi facet mirrors that are used in the illumination system of DUV or VUV projection exposure apparatus for variably illuminating a pupil surface.

The optical system may be an illumination system of the projection exposure apparatus. However, in principle the multi mirror facet may also be arranged in a projection objective of the apparatus if it is arranged sufficiently far away from one of its field planes. The apparatus may be an EUV apparatus, but also apparatus for longer wavelengths, for example in the DUV or VUV spectral range, are envisaged.

According to a second aspect of the disclosure, the object stated further above is achieved by an optical system of a microlithographic projection exposure apparatus, wherein the optical system includes a multi facet mirror. The multi facet mirror includes a support plate and a plurality of mirror facets. Each mirror facet includes a mirror substrate and a reflective coating applied thereon, and is attached to the support plate. The multi facet mirror further includes at least one actuator that is configured to induce a deformation of the support plate. The at least one actuator is configured to induce a continuous range of different deformations of the support plate.

Subject of the present disclosure is also a multi facet mirror which is configured to be mounted in a microlithographic projection exposure apparatus. The multi facet mirror includes a support plate and a plurality of mirror facets. Each mirror facet includes a mirror substrate and a reflective coating applied thereon and is attached to the support plate. At least one actuator is provided that is configured to induce a deformation of the support plate. This deformation induced by the at least one actuator changes the orientation and/or position, but not the shape, of at least two mirror facets.

BRIEF DESCRIPTION OF THE DRAWINGS

Various features and advantages of the present disclosure may be more readily understood with reference to the following detailed description taken in conjunction with the accompanying drawing in which.

DESCRIPTION OF PREFERRED EMBODIMENTS

I. General Construction of Projection Exposure Apparatus

Figure 1:
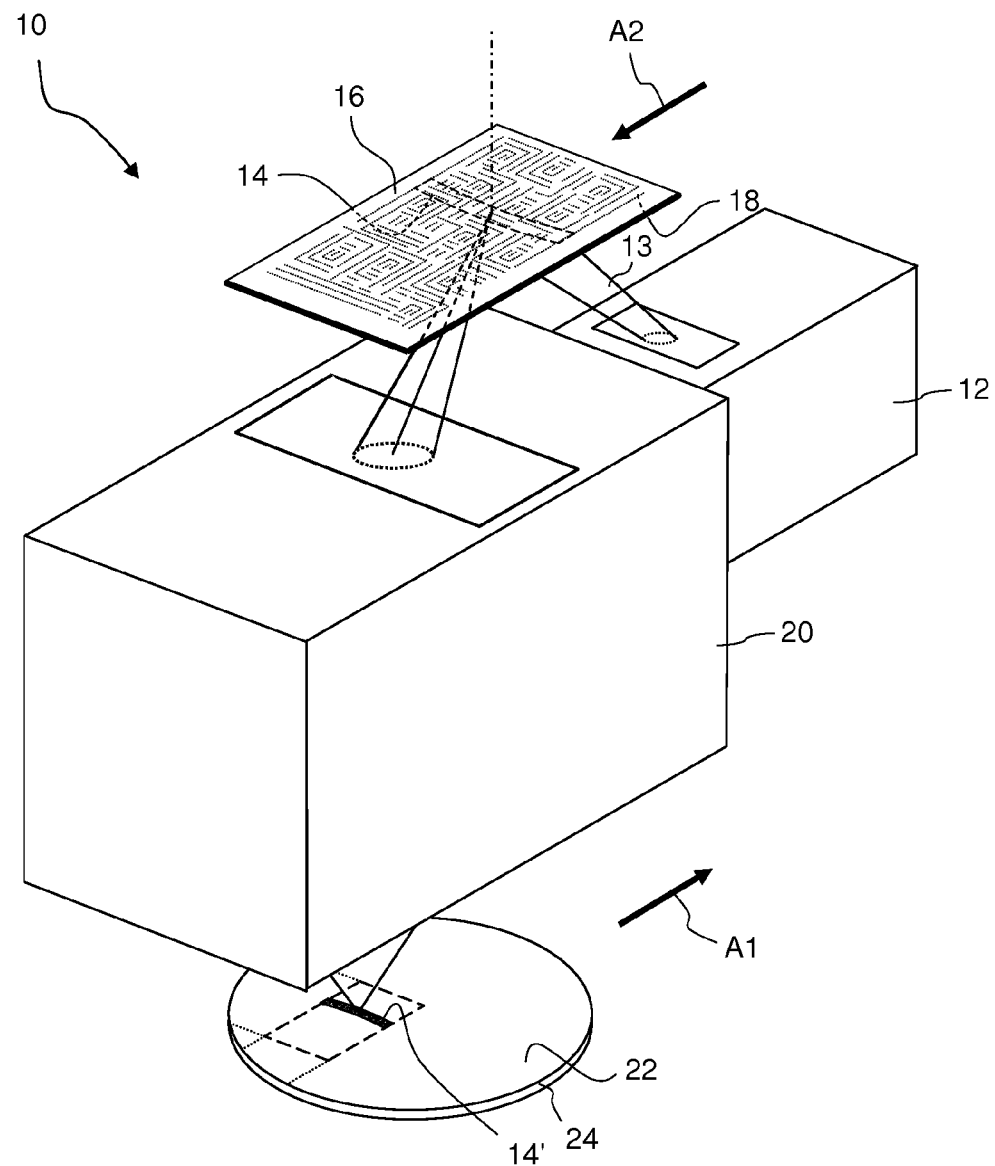
FIG. 1 is a perspective schematic view of an EUV microlithographic projection exposure apparatus in accordance with the present disclosure.

FIG. 1 is a perspective and highly simplified view of a EUV projection exposure apparatus 10 in accordance with the present disclosure. The apparatus 10 includes an illumination system 12 which produces a projection light beam 13 having a wavelength in the EUV spectral range, for example 13.4 nm. The projection light beam illuminates from below a field 14 on a mask 16 which contains on its underside a reflective pattern 18 formed by a plurality of small features. In this embodiment the illuminated field 14 has the shape of a ring segment.

A projection objective 20 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned via a mask stage (not shown) in an object plane of the projection objective 20. Since the latter has a magnification $\beta$ with $|\beta|<1$, a minified image 14' of the pattern 18 within the illuminated field 14 is projected onto the light sensitive layer 22.

Because there are no optical materials available that are transparent for the EUV projection light beam 13, it is not possible to use lenses or other refractive optical elements in the apparatus 10. Instead, the illumination system 12 and the projection objective 20 contain only mirrors as optical elements (apart from stops). Also the mask 16 is reflective.

During the projection the mask 16 and the substrate 24 move along a scan direction which coincides with the Y direction indicated in FIG. 1. The illuminated field 14 then scans over the mask 16 so that patterned areas larger than the illuminated field 14 can be continuously projected. The ratio between the velocities of the substrate 24 and the mask 16 is equal to the magnification $\beta$ of the projection objective 20. If the projection objective 20 inverts the image ($\beta<0$), the mask 16 and the substrate 24 move in opposite directions, as this is indicated in FIG. 1 by arrows A1 and A2.

However, the present disclosure may also be used in stepper tools in which the mask 16 and the substrate 24 do not move during projection of the mask, or in DUV or VUV projection exposure apparatus containing lenses and other refractive optical elements.

II. Multi Facet Mirror

The illumination systems of DUV or VUV projection exposure apparatus often contain fly's eyes lenses or other optical raster elements. In EUV illumination systems the task of optical raster elements is taken over by multi facet mirrors including a plurality of small mirror facets.

Figure 2:
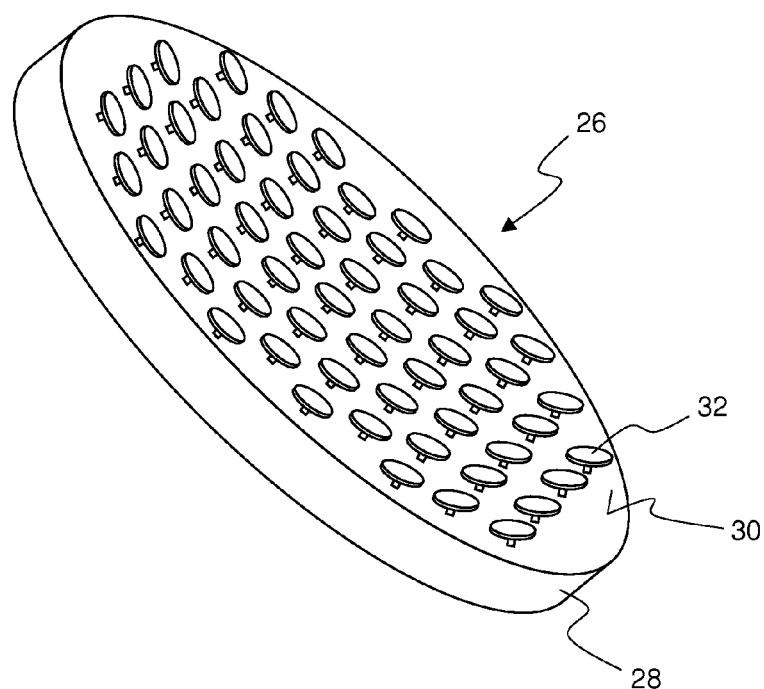
FIG. 2 is a simplified perspective view of a multi facet mirror according to one embodiment of the present disclosure including mirror facets that are attached to a support plate.

FIG. 2 is a perspective view of a multi facet mirror contained in the illumination system 12 and denoted in its entirety by 26. The multi facet mirror 26 includes a support plate 28 which supports on its top surface 30 a plurality of mirror facets 32. In this embodiment the mirror facets 32 have different orientations so that parallel light impinging on the mirror facets 32 is reflected into different directions depending on the mirror facet 32 on which the light impinges. It should be noted that in a real multi facet mirror 26 the density of the mirror facets 32 may be much higher so that the total area of the multi facet mirror 26 which is not reflective is minimized.

In this embodiment the support plate 28 has plane and parallel surfaces and is made of steel. However, other shapes and other materials are envisaged as well.

Figure 3:
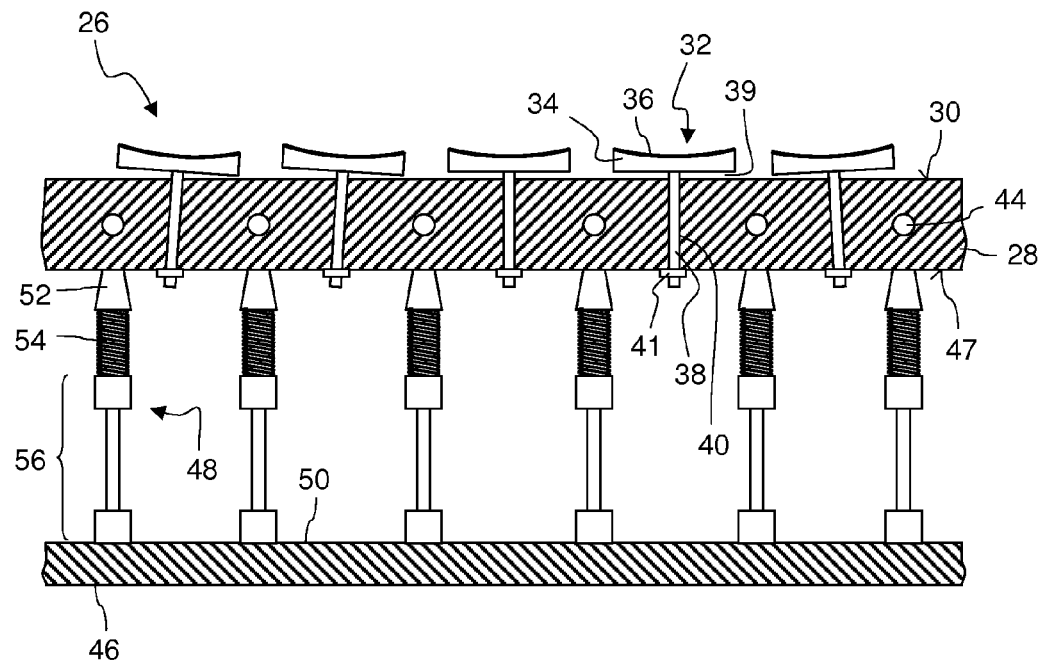
FIG. 3 is a partial cross-section through the multi facet mirror shown in FIG. 2 and through actuators used to deform the support plate.

FIG. 3 is a simplified partial cross section through the multi facet mirror 26 and further components that will be explained in more detail below.

Each mirror facet 32 includes a mirror substrate 34 and a reflective coating 36 applied thereon. The mirror substrate 34 is connected to a pin 38 which is guided through a bore 40 extending through the support plate 28. The pin 38 supporting the mirror substrate 34 is fixed to the support plate 28 by a fixing mechanism 41 which are attached to a bottom surface 42 of the support plate 28. The length of the pin 38 is selected such that a small gap 39 remains between the mirror substrate 34 and the top surface 30 of the support plate 28.

In a plane parallel to the top surface 30 of the support plate 28 a plurality of channels 44 extend through the support plate 28. During operation of the apparatus 10 a cooling fluid flows through the channels 44 so as to maintain a constant temperature distribution within the support plate 28. Temperature stabilization is an issue in such a multi facet mirror 26 because a significant portion of the projection light is not reflected by the reflective coating 38, but absorbed by the mirror facets 32. The heat resulting from this absorption is mainly conducted via the pins 38 into the support plate 28. If the temperature distribution within the support plate 28 is not kept constant, the support plate 28 will eventually warp and thereby change the orientation of the mirror facets 32. This will result in aberrations that eventually compromise the imaging of the pattern 18.

Between a support structure 46, which is significantly more rigid than the support plate 28, and a bottom surface 47 of the support plate 28 a plurality of actuators 48 extend. In this embodiment a top surface 50 of the rigid support structure 46 is arranged parallel to the bottom surface 47 so that the distance between the two surfaces 47, 50 is approximately uniform. Along a circumferential region the support plate 28 rests directly on the rigid support structure 46 (not shown) so that the actuators 48 do not support the weight of the support plate 28 and of the mirror facets 32 attached to it.

Each actuator 48 includes a connector element 52 which is connected to the bottom surface 47 of the support plate 28. The connector element 52 is connected via a resilient member 54 to a displacement member 56 whose length can be varied by supplying energy to the displacement element 56. The displacement element 56 may include one or more stacks of piezo-electric elements, or may be formed by a small hydraulic circuit that enables the axial length of the displacement element 56 to be varied. In this embodiment it is assumed that in a neutral state, as it is shown in FIG. 3, neither tensile nor pressure forces are exerted by the actuators 48 on the support plate 28.

If the length of some or all displacement elements 56 is changed, also the forces which are present between the rigid support structure 46 and the support plate 28 will vary. More specifically, if the length of the displacement element 56 is increased from the neutral state, a pressure force will be exerted on the support plate 28, and if the length decreases, a tensile force is produced.

Figure 4:
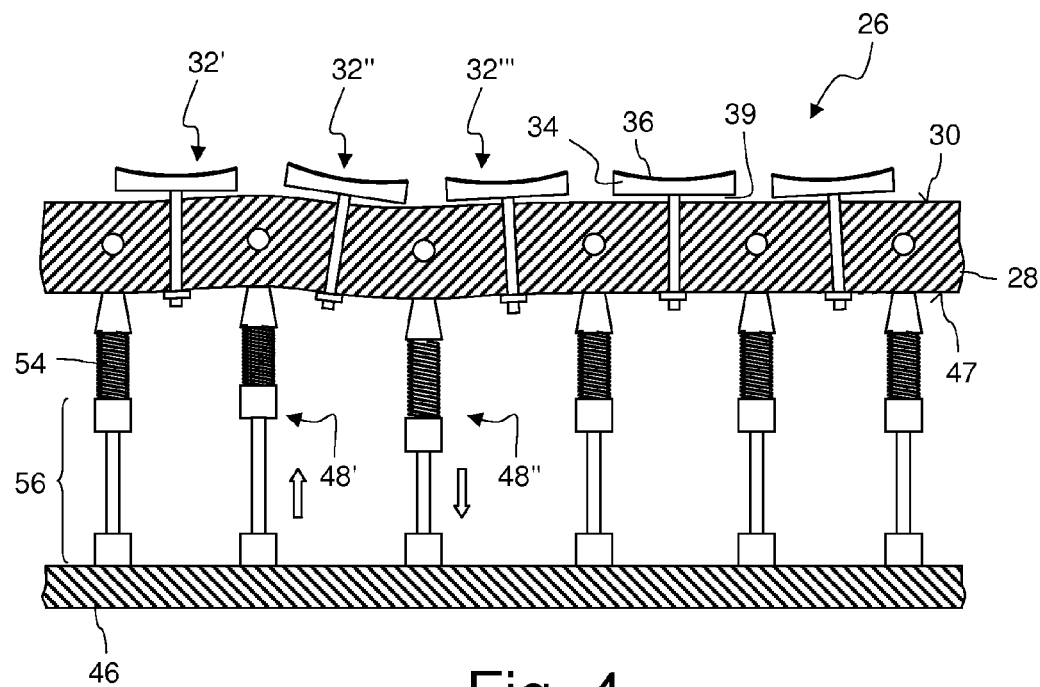
FIG. 4 is a cross-section similar to FIG. 3, but with some of the actuators being in a different operating state so that the support plate is deformed.

This is shown in FIG. 4 which is identical to FIG. 3 except that two of the actuators denoted by 48' and 48" have been operated. The actuator 48' has increased its length, whereas the actuator 48" has decreased its length, as it is indicated by arrows in FIG. 4. As a result of the pressure force exerted by the actuator 48' and the tensile force exerted by the actuator 48", and also because the support structure 46 is much more rigid than the support plate 28, the latter is deformed from its original state so that the top surface 30 and the bottom surface 47 are not plane anymore, at least in the vicinity of the two actuators 48' and 48".

Since the mirror facets 32 are rigidly connected to the support plate 28, the deformation of the support plate 28 is transferred to the mirror facets 32. As a result of this, the orientation of the mirror facets 32 changes, as it is indicated for three mirror facets 32', 32" and 32'" in FIG. 4. The rotation of the mirror facets 32', 32", 32'" which causes this change of orientation, may be accompanied by a (small) positional change, i.e. a small translational movement. Depending on the operation of the actuators 48, it may also be possible that at least some mirror facets 32 mainly change their position, but not or only slightly change their orientation.

However, the shape of the mirror substrate 34 (and thus also of the reflective coating 36 applied thereon) is not changed by the deformation of the support plate 28. This is partly due to the fact that the mirror substrates 34 of the mirror facets 32 are attached to the top surface 30 of the support plate 28 via the pins 38. The gaps 39 have the effect that forces produced by the actuators 48 can be transferred to the mirror substrates 34 only via the pins 38. However, such forces may at most have the effect that the pins 38 are bent or sheared, but this does not have any impact on the shape of the mirror substrates 34 supported by the pins 38.

The ability of the multi facet mirror 26 to modify the orientation and/or position of the mirror facets 32 may be used to compensate an undesired deformation of the support plate 28. For example, the support plate 28 has to be fixed to the rigid support structure 46 or any other rigid structure of the illumination system 12. Then forces may be exerted on the support plate 28 which are difficult to be controlled, and such forces may ultimately result in slight and undesired deformations of the support plate 28. Another cause of undesired deformations of the support plate 28 are changes of the temperature distribution, as it has been explained further above.

However, the ability of the multi facet mirror 26 to modify the orientation and/or position of the mirror facets 32 can be used more generally to correct aberrations in the illumination system 12, including transient aberrations that depend on the operating conditions of the apparatus 10. Once the aberrations are determined, and assuming that these aberrations can be reduced by a suitable change of the orientation and/or position of the mirror facets 32, the actuators 48 may be controlled in such a way that the aberrations are reduced.

III. Alternative Embodiments

Figure 5:
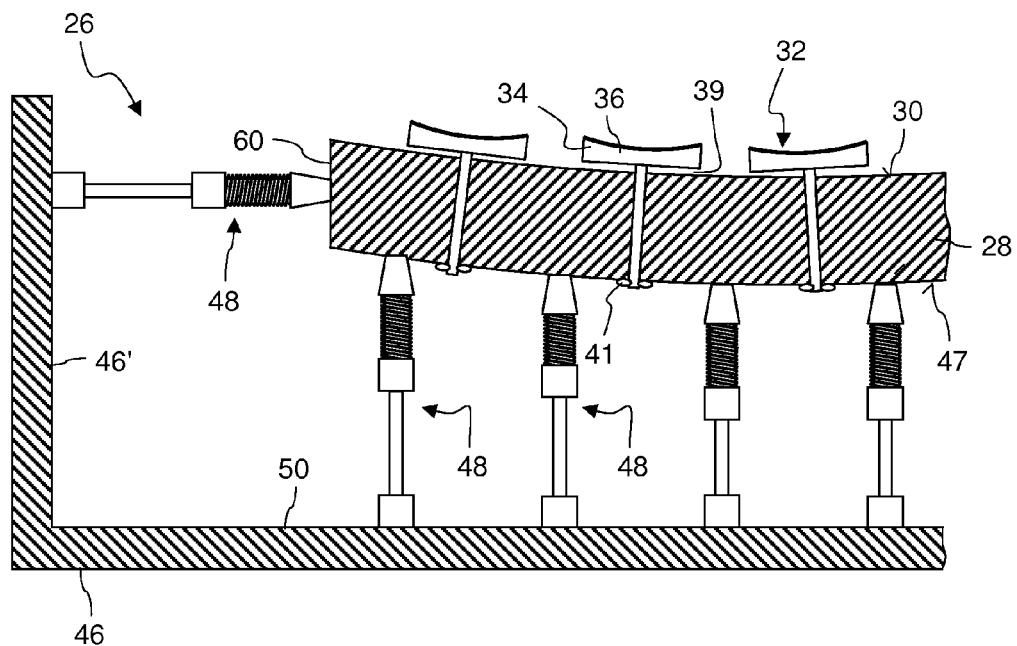
FIG. 5 is a cross-section similar to FIG. 3 according to another embodiment in which actuators also act on a circumferential surface of the support plate.

FIG. 5 is a cross section similar to FIG. 3 of an alternative embodiment. In this embodiment actuators 48 are not only provided between the rigid support structure 46 and the bottom surface 47 of the support plate 28, but also between a perpendicular rigid support structure 46' and a circumferential surface 60 of the support plate 28. An actuator 48 producing pressure or tensile forces on such a circumferential surface 60 is particularly useful if the support plate 28 is in its original neutral state not plane, but is convexly or concavely curved, as it is shown in FIG. 5. Then forces exerted on a circumferential surface 60 can be used to change the curvature of the support plate 28.

Generally the addition of another direction along which pressure or tensile forces can be exerted on the support plate 28 increases the possible range of deformations that may be produced in the support plate 28.

Figure 6:
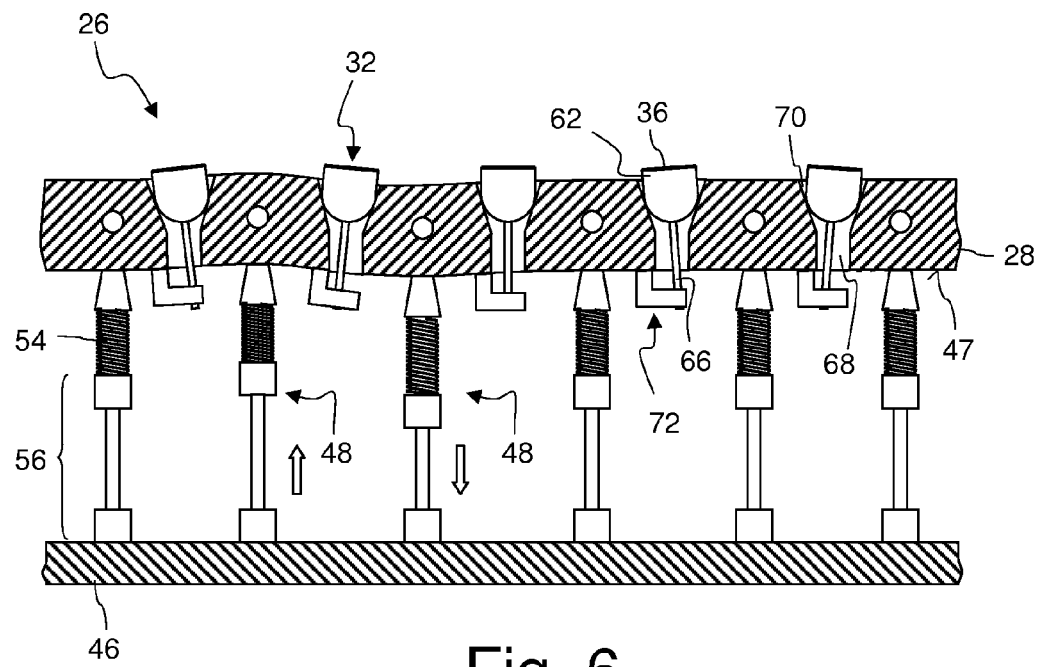
FIG. 6 is a cross-section similar to FIG. 3 according to still another embodiment in which additional facet actuators are provided to tilt the mirror facets individually.

FIG. 6 is a cross-section similar to FIG. 3 of an embodiment of the present disclosure in which the multi facet mirror 26 is provided with a plurality of facet actuators that are configured to change the orientation of the mirror facets 32 with respect to the support plate 28 individually. To this end each of the mirror facets 32 has a truncated ball-shaped body portion 62 having a flat or curved area on which the reflective coating 36 is applied. From this body portion 62 an actuating pin 66 extends that has a longitudinal axis which coincides with an axis of symmetry of the ball-shaped body portion 62.

The support plate 28 of this embodiment is provided with a plurality of bores 68. Each bore 68 widens towards the upper surface of the support plate 28 into a truncated cone 70. The recess formed by this cone 70 serves as a socket for the ball-shaped body portion 62 of the associated mirror facet 32. The actuating pin 66 extends through the cone 70 and the bore 68 and projects from the bottom surface 47 of the support plate 28. The projecting portion of each actuating pin 66 is connected to a facet actuator 72 which is configured to move the actuating pin 66. These movements are transferred into tilt movements of the body portion 62 of the mirror facet 32. Further details with regard to the mirror facets 32 and the facet actuators 72 shown in FIG. 6 can be gleaned from US 2005/0030653 A1.

With the help of the facet actuators 72 it is possible to tilt the associated mirror facet 32 within a range of several degrees. The accuracy of this tilting movement, however, is restricted usually to a few mrad.

If the orientation of the mirror facets 32 has been slightly changed, for example as a result of a small deformation of the support plate 28, it is difficult to readjust the individual mirror facets 32 with the help of the facet actuators 72 with the desired accuracy. This is because such changes of the orientations may be in the range of a few grad, and such minute angles cannot be accurately set by the mirror facets.

However, with the help of the actuators 48 that deform the support plate 28 it is possible to accurately induce such small changes of the orientations of the mirror facets 32.

Figure 7:
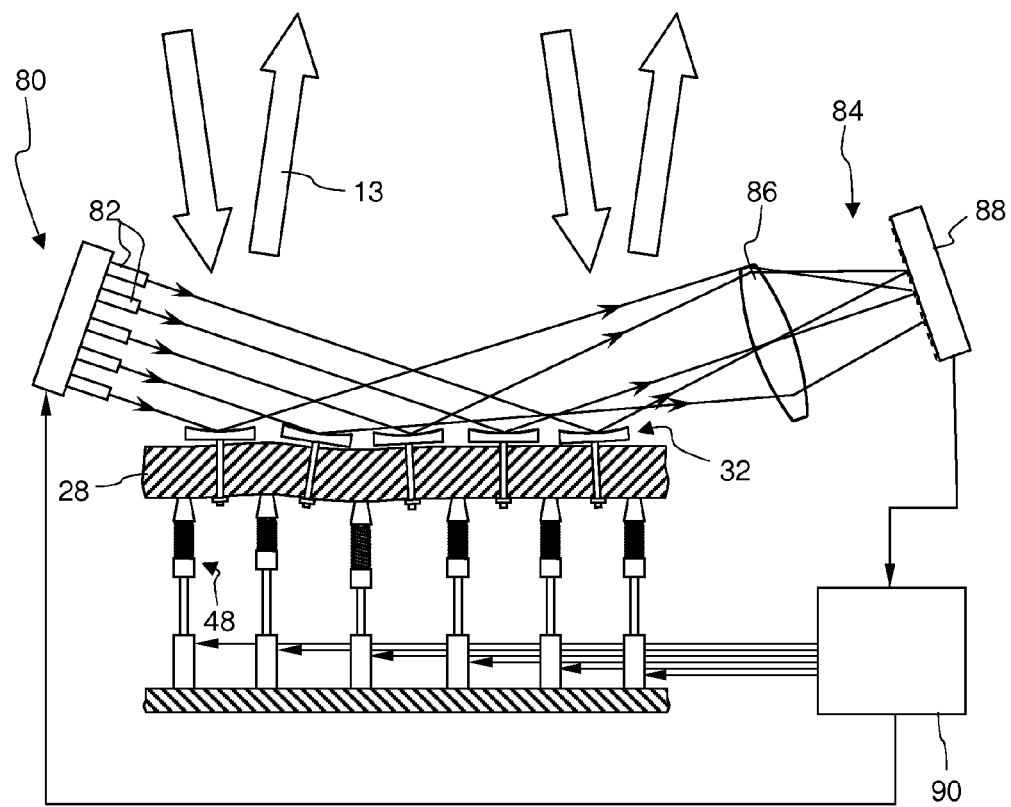
FIG. 7 is a schematic cross-section similar to FIG. 3 according to another embodiment of the disclosure in which a measurement system, which measures the orientation of the mirror facets, is part of a closed control loop for controlling the actuators.

FIG. 7 is a schematic view of an embodiment in which the actuators 48 form part of a closed loop control circuit. The control circuit includes a measurement system 80 which is configured to measure the orientations of the mirror facets 32 individually. To this end the measurement system 80 includes a plurality of light sources 82 which may be configured as infrared (IR) LEDs. Each light source 82 directs an IR light beam on one of the mirror facets 32. These light beams do not interfere with the projection light 13 indicated by arrows.

The measurement system 80 further includes a detector 84 that is configured to detect the direction of the light beams after they have been reflected by the mirror facets 32. To this end the detector 84 includes a lens 86 and an image sensor 88 which is arranged in a focal plane of the lens 86. The lens 86 transforms the directions of the reflected light beams into locations on the image sensor 88. The image sensor 88 is connected to a control unit 90 that controls the actuators 48 and also the light sources 82. The control unit 90 determines the orientations of the mirror facets 32 by evaluating where on the image sensor 88 the reflected light beams produced by the light sources 82 impinge. The control unit 90 is able to determine which signal produced on the image sensor 88 is associated with a particular mirror facet 32. To this end various multiplexing schemes may be used, for example time division, amplitude division, frequency division or code division multiplexing. Further details with regard to the measurement system 80 and alternative embodiments for such a measurement system can be gleaned from US 2010/0039629 A1.

The control unit 90 compares the orientations of the mirror facets 32 measured with the help of the measurement system 80 with target values which may have been provided by an overall system control. If these measured values for the orientation of the mirror facets 32 differ too much from the corresponding target values, the control unit 90 controls the actuators 48 depending on the orientations of the mirror facets 32 that have been measured by the measurement system 80. More particularly, the control unit 90 determines which of the actuators 48 have to be operated, and to which extent the displacement elements 56 contained therein have to change their length. The operation of the selected actuators 48 results in a deformation of the support plate 28 and also in a change of the orientation and/or position of at least some of the mirror facets 32. A closed-loop circuit is established so that the deformation of the support plate 28 is changed again if the measured values for the mirror facet orientation are still not sufficiently close to the corresponding target values.

What is claimed is:

1. An optical system, comprising:
   a multi facet mirror comprising:
   a support plate;
   a plurality of mirror facets, each mirror facet comprising a mirror substrate and a reflective coating supported by the mirror substrate, and each mirror facet being attached to the support plate; and
   at least one actuator configured to deform the support plate,
   wherein:
   during use of the optical system, each deformation caused by the at least one actuator changes a relative orientation and/or a relative position of at least two mirror facets without changing a shape of the at least two mirror facets;
   the support plate has a circumferential surface to which the at least one actuator is connected;
   the at least one actuator is configured to produce pressure forces and/or tensile forces on the circumferential surface of the support plate;
   the at least one actuator comprises:
   a connector element connected to the support plate;
   a displacement element having a length that is variable by supplying energy to the displacement element; and a resilient member between the connector element and the displacement element; and the optical system is a microlithographic illumination system.

2. The optical system of claim 1, comprising facet actuators configured to individually change the orientation and/or the position of the mirror facets with respect to the support plate.

3. The optical system of claim 1, wherein the mirror facets are fixedly attached to the support plate so that the mirror facets cannot be adjusted with respect to the support plate.

4. The optical system of claim 1, wherein the at least one actuator is configured to induce a continuous range of different deformations of the support plate.

5. The optical system of claim 1, wherein, for at least some of the mirror facets, a gap is present between a portion of the mirror substrate and the support plate.

6. The optical system of claim 1, wherein the at least one actuator is configured to produce tensile forces and pressure forces on the circumferential surface of the support plate.

7. The optical system of claim 1, wherein the support plate is between the mirror facets and the at least one actuator, and the at least one actuator is connected to a surface of the support plate.

8. The optical system of claim 1, wherein, when the at least one actuator is not operated, the support plate is convexly curved or concavely curved.

9. The optical system of claim 1, further comprising:
a measurement system configured to individually measure an orientation of each mirror facet; and
a control unit configured to control the at least one actuator depending on the orientations of the mirror facets measured by the measurement system.

10. The optical system of claim 9, wherein the measurement system comprises:
a light source configured to direct a light beam on at least one mirror facet; and
a detector configured to detect a direction of the light beam after it has been reflected by the at least one mirror facet.

11. The optical system of claim 1, wherein the at least one actuator is configured to produce tensile forces on the circumferential surface of the support plate.

12. The optical system of claim 1, wherein the at least one actuator is configured to produce pressure forces on the circumferential surface of the support plate.

13. A multi facet mirror, comprising:
a support plate;
a plurality of mirror facets, each mirror facet comprising a mirror substrate and a reflective coating supported by the mirror substrate, and each mirror facet being attached to the support plate; and
at least one actuator configured to deform the support plate, wherein:
during use of the optical system, each deformation caused by the at least one actuator changes a relative orientation and/or a relative position of at least two mirror facets without changing a shape of the at least two mirror facets; and
the multi facet mirror is configured to be used in a microlithographic illumination system; and
wherein the at least one actuator comprises:
a connector element connected to the support plate;
a displacement element having a length that is variable by supplying energy to the displacement element; and
a resilient member between the connector element and the displacement element.

14. The multi facet mirror of claim 13, comprising facet actuators configured to individually change the orientation and/or the position of the mirror facets with respect to the support plate.

15. The multi facet mirror of claim 13, wherein the mirror facets are fixedly attached to the support plate so that the mirror facets cannot be adjusted with respect to the support plate.

16. The multi facet mirror of claim 13, wherein the at least one actuator is configured to induce a continuous range of different deformations of the support plate.

17. The multi facet mirror of claim 13, wherein, for at least some of the mirror facets, a gap is present between a portion of the mirror substrate and the support plate.

18. The multi facet mirror of claim 13, wherein the at least one actuator is configured to produce tensile forces and/or pressure forces on the support plate.

* * * * *

UNITED STATES PATENT AND TRADEMARK OFFICE
CERTIFICATE OF CORRECTION

PATENT NO.         : 9,213,245 B2
APPLICATION NO.    : 13/715000
DATED              : December 15, 2015
INVENTOR(S)        : Damian Fiolka and Juergen Baier Page 1 of 1

It is certified that error appears in the above-identified patent and that said Letters Patent is hereby corrected as shown below:

In the specification

Col. 9, line 58, delete "grad," and insert -- μrad, --.

Signed and Sealed this
Thirty-first Day of May, 2016

Michelle K. Lee
*Director of the United States Patent and Trademark Office*